(12) United States Patent
Luo et al.

(10) Patent No.: US 11,612,082 B2
(45) Date of Patent: Mar. 21, 2023

(54) COOLING SYSTEM

(71) Applicant: Beijing Baidu Netcom Science and Technology Co., Ltd., Beijing (CN)

(72) Inventors: Zhiming Luo, Beijing (CN); Yiyi Duan, Beijing (CN); Bin Yi, Beijing (CN); Xiaozhong Li, Beijing (CN)

(73) Assignee: Beijing Baidu Netcom Science Technology Co., Ltd., Beijing (CN)

( * ) Notice: Subject to any disclaimer, the term of this patent is extended or adjusted under 35 U.S.C. 154(b) by 276 days.

(21) Appl. No.: 17/035,020

(22) Filed: Sep. 28, 2020

(65) Prior Publication Data
US 2021/0360831 A1    Nov. 18, 2021

(30) Foreign Application Priority Data

May 15, 2020  (CN) .......................... 202010412777.4
May 15, 2020  (CN) ......................... 202020812415.X

(51) Int. Cl.
*H05K 7/20*   (2006.01)
*H01L 23/46*  (2006.01)
*F28D 21/00*  (2006.01)

(52) U.S. Cl.
CPC ......... *H05K 7/20818* (2013.01); *H01L 23/46* (2013.01); *H05K 7/20309* (2013.01);
(Continued)

(58) Field of Classification Search
CPC ........... H05K 7/20818; H05K 7/20309; H05K 7/20318; H05K 7/20836; H05K 7/20354; F28D 2021/0028; H01L 23/46
(Continued)

(56) References Cited

U.S. PATENT DOCUMENTS 5,469,713 A * 11/1995 Wardle ................ F16C 33/6688
                                                        62/84
2001/0037651 A1* 11/2001 Butterworth ........ F04D 29/5806
                                                       62/468
(Continued)

FOREIGN PATENT DOCUMENTS

CN    106440437 A  *  2/2017  ................ F25B 1/00
CN    106440437 A      2/2017
(Continued)

OTHER PUBLICATIONS

CN-106440437—A with translation.*
(Continued)

*Primary Examiner* — Jon T. Schermerhorn, Jr.
(74) *Attorney, Agent, or Firm* — Maginot, Moore & Beck LLP

(57) ABSTRACT

A cooling system for a data center includes an evaporative condenser, a pump cabinet and a heat exchange terminal. The pump cabinet has a first branch and a second branch, the first branch including a liquid storage tank and a fluorine pump. An input end of the liquid storage tank is connected to an output end of the evaporative condenser, an output end of the liquid storage tank is connected to an input end of the fluorine pump, and an output end of the fluorine pump is connected to an input end of the heat exchange terminal. The second branch includes a compressor with an input end connected to an output end of the heat exchange terminal and an output end connected to an input end of the evaporative condenser.

7 Claims, 3 Drawing Sheets

(52) U.S. Cl.
 CPC ..... *H05K 7/20318* (2013.01); *H05K 7/20354* (2013.01); *H05K 7/20836* (2013.01); *F28D 2021/0028* (2013.01)

(58) Field of Classification Search
 USPC ........................................................ 165/80.5
 See application file for complete search history.

(56) References Cited

U.S. PATENT DOCUMENTS

| | | | |
|---|---|---|---|
| 2018/0180333 A1* | 6/2018 | Sishtla | .................. F25B 31/002 |
| 2019/0178537 A1 | 6/2019 | Nieforth et al. | |
| 2019/0208668 A1 | 7/2019 | Tang et al. | |
| 2022/0034524 A1* | 2/2022 | Mori | ........................ F24F 11/42 |

FOREIGN PATENT DOCUMENTS

| | | |
|---|---|---|
| CN | 106642778 A | 5/2017 |
| CN | 108055813 A | 5/2018 |
| CN | 108882657 A | 11/2018 |
| CN | 109140627 A | 1/2019 |

OTHER PUBLICATIONS

Extended European Search Report corresponding to European Patent Application No. 21152997.9, dated Jun. 28, 2021 (7 pages).
European Office Action corresponding to European Patent Application No. 21152997.9, dated Jun. 7, 2022 (5 pages).

* cited by examiner

COOLING SYSTEM

This application claims priority under 35 U.S.C. § 119 to application no. CN 202010412777.4, filed on May 15, 2020 in China, and to application no. 202020812415.X, filed on May 15, 2020 in China, the disclosures of which are incorporated herein by reference in their entirety.

TECHNICAL FIELD

The present disclosure relates to the field of data center technology, especially to the field of cooling technology for data centers, specifically to a cooling system.

BACKGROUND

Data centers comprise a complex set of devices, includes not only a computer system and its supporting equipment, but also a redundant data communication connecting device, environmental controlling device, monitoring device as well as various safety devices.

Each of the devices comprised in the data center may generate a large amount of heat during its operation, and the devices comprised in the data center will be damaged due to excessive temperature if the generated heat is not promptly dissipated, so as to affect normal operation of the data center.

For this purpose, the data center is required to be equipped with a cooling system in order to maintain normal operating temperatures of each of the devices within the data center.

At present, a traditional chilled water data center design is generally used for cooling of the data center. However, due to the problems of large numbers of heat exchange links and a one-way working medium are provided in this solution, energy consumption of the cooling system is relatively high with a poor overall energy performance.

SUMMARY

The present disclosure provides a cooling system.

According to a first aspect, the present disclosure provides a cooling system comprising: an evaporative condenser, a pump cabinet and a heat exchange terminal, the pump cabinet comprises a first branch and a second branch. The first branch includes a liquid storage tank and a fluorine pump, an input end of the liquid storage tank is connected to an output end of the evaporative condenser, an output end of the liquid storage tank is connected to an input end of the fluorine pump, and an output end of the fluorine pump is connected to an input end of the heat exchange terminal. A compressor is included in the second branch in which its input end is connected to an output end of the heat exchange terminal and its output end is connected to an input end of the evaporative condenser.

Based on the technology of the present disclosure, it is possible to first perform a phase-change heat exchange of a gaseous cooling agent transmitted in the second branch of the pump cabinet with spraying water via the evaporative condenser to transform it into a liquid cooling agent. The liquid cooling agent is then transmitted to the heat exchange terminal through the first branch via the liquid storage tank and the fluorine pump of the first branch of the pump cabinet. Next, perform an air-returning heat exchange of the liquid cooling agent transmitted through the first branch with the interior air of the data center via the heat exchange terminal to transform it into a gaseous cooling agent. Finally, the air-returning heat exchanged gaseous cooling agent in the heat exchange terminal is again transmitted to the evaporative condenser through the second branch via the compressor of the second branch in the pump cabinet.

As such, the cooling system is able to perform an air-returning heat exchange with the interior air of the data center via the liquid cooling agent of phase-change heat exchange working medium to cool the data center, and return the air-returning heat exchanged gaseous cooling agent to the evaporative condenser through a circulation path formed by the evaporative condenser, the pump cabinet and the heat exchange terminal so as to perform a phase-change heat exchange to the gaseous cooling agent to transform it into a liquid cooling agent for an air-returning heat exchange with the interior air of the data center, so that to reduce heat exchange links of the cooling system and thus its energy consumption, to improve energy performance of the cooling system. The present disclosure solves the problem in the prior art that energy consumption of the cooling system is relatively high with a poor overall energy performance since large numbers of heat exchange links and an one-way working medium are provided.

It should be understood that contents described in this part of the specification are not intended to indicate key features or critical features of the embodiments of the present disclosure nor limit the scope thereof. Other features of the present disclosure will be easily understood with the following description.

BRIEF DESCRIPTION OF THE DRAWINGS

The attached drawings are provided for better understanding of the present solution in a non-limiting way, in which.

DETAILED DESCRIPTION

Exemplified embodiments of the present disclosure are explained hereafter in conjunction with the attached drawings, in which various details of the embodiments of the present disclosure are included merely by way of example to facilitate understanding thereof. The person having ordinary skill in the art should therefore note that various modifications and changes can be made to the embodiments described herein without departing from the scope and spirit of the present disclosure. Also, the description of well-known function and structure is omitted hereafter for clarity and briefness.

First Embodiment

Figure 1:
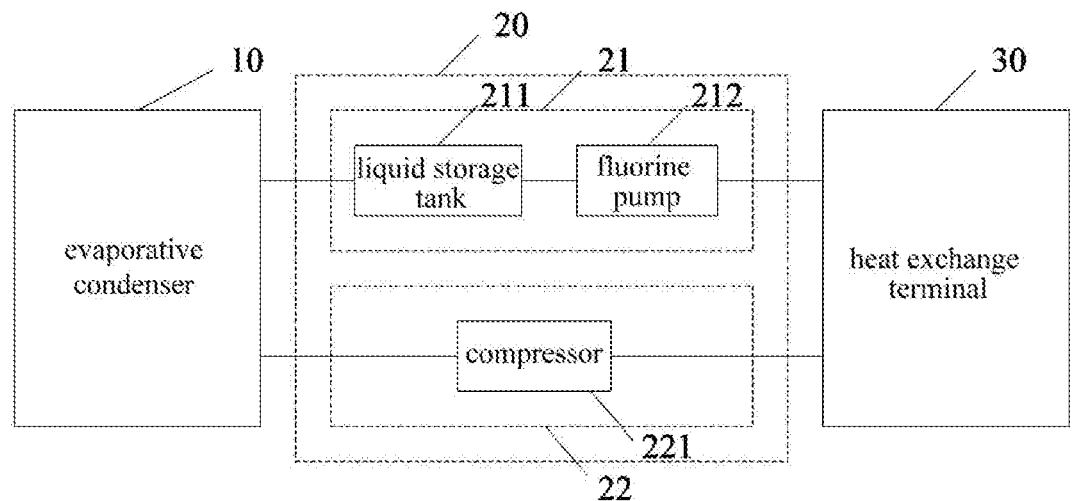
FIG. 1 is a schematic view shows structure of a cooling system according to a first embodiment of the present disclosure.

Reference is first made to FIG. 1, which is a schematic view shows structure of a cooling system according to a first embodiment of the present disclosure. As shown in FIG. 1, the cooling system comprises: an evaporative condenser 10, a pump cabinet 20 and a heat exchange terminal 30, the pump cabinet 20 comprises a first branch 21 and a second branch 22. The first branch 21 includes a liquid storage tank 211 and a fluorine pump 212, an input end of the liquid storage tank 211 is connected to an output end of the evaporative condenser 10, an output end of the liquid storage tank 211 is connected to an input end of the fluorine pump 212, and an output end of the fluorine pump 212 is connected to an input end of the heat exchange terminal 30. A compressor 221 is included in the second branch 22 in which its input end is connected to an output end of the heat exchange terminal 30 and its output end is connected to an input end of the evaporative condenser 10.

The cooling system forms a circulation path through the evaporative condenser 10, the first branch 21 in the pump cabinet 20, the heat exchange terminal 30 and the second branch 22 in the pump cabinet 20.

Figure 2:
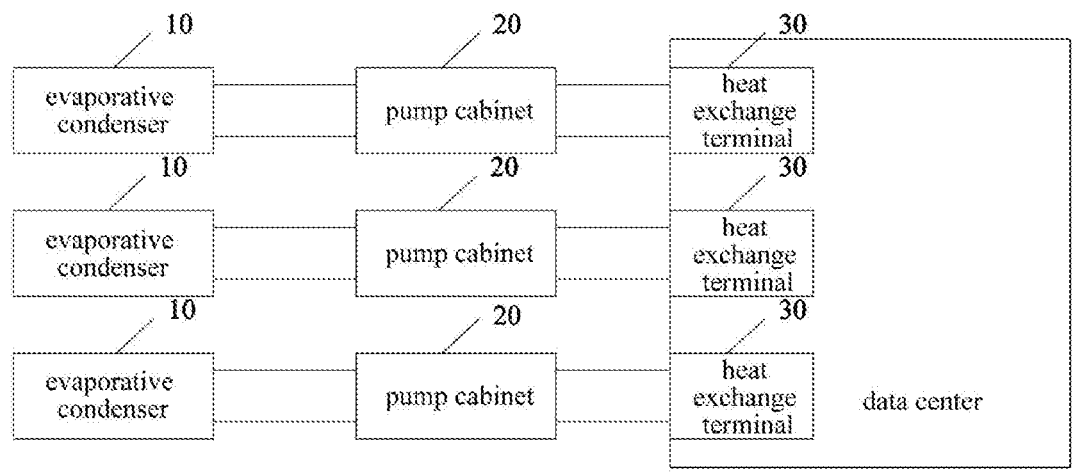
FIG. 2 is a schematic view shows structure of the cooling system of a data center.

Reference is made to FIG. 2, which is a schematic view showing the structure of the cooling system of a data center. As shown in FIG. 2, the evaporative condenser 10 is provided outside the data center such as in a phase-change cooling tower, the heat exchange terminal 30 is provided inside the data center, while the pump cabinet 20 is provided between the evaporative condenser 10 and the heat exchange terminal 30 for communicating the evaporative condenser 10 with the heat exchange terminal 30 to form the circulation path.

The evaporative condenser 10 is provided for transforming a gaseous cooling agent transmitted in the second branch 22 of the pump cabinet 20 into a liquid cooling agent by make it phase-change heat exchange with spraying water.

The first branch 21 in the pump cabinet 20 is provided for transmitting the liquid cooling agent to the heat exchange terminal 30 through the first branch 21. Specifically, the liquid storage tank 211 is provided for storing the liquid cooling agent which is phase-change heat exchanged via the evaporative condenser 10. The fluorine pump 212 is provided for transmitting the liquid cooling agent in the liquid storage tank 211 to the heat exchange terminal 30 through the first branch 21.

The heat exchange terminal 30 is provided for transforming the liquid cooling agent transmitted in the first branch 21 into a gaseous cooling agent by make it air-returning heat exchange with the interior air of the data center.

The compressor 221 of the second branch 22 in the pump cabinet is provided for transmitting the gaseous cooling agent which is air-returning heat exchanged via the heat exchange terminal 30 to the evaporative condenser 10 through the second branch 22.

The liquid storage tank 211 may further comprise a filling port by means of which the liquid cooling agent may added into the liquid storage tank 211 before power up the cooling system.

The cooling agent is a phase-change heat exchange working medium, that is to say it is able to transfer a liquid cooling agent into a gaseous cooling agent by endothermic action and transfer a gaseous cooling agent into a liquid cooling agent by exothermic action.

Figure 3:
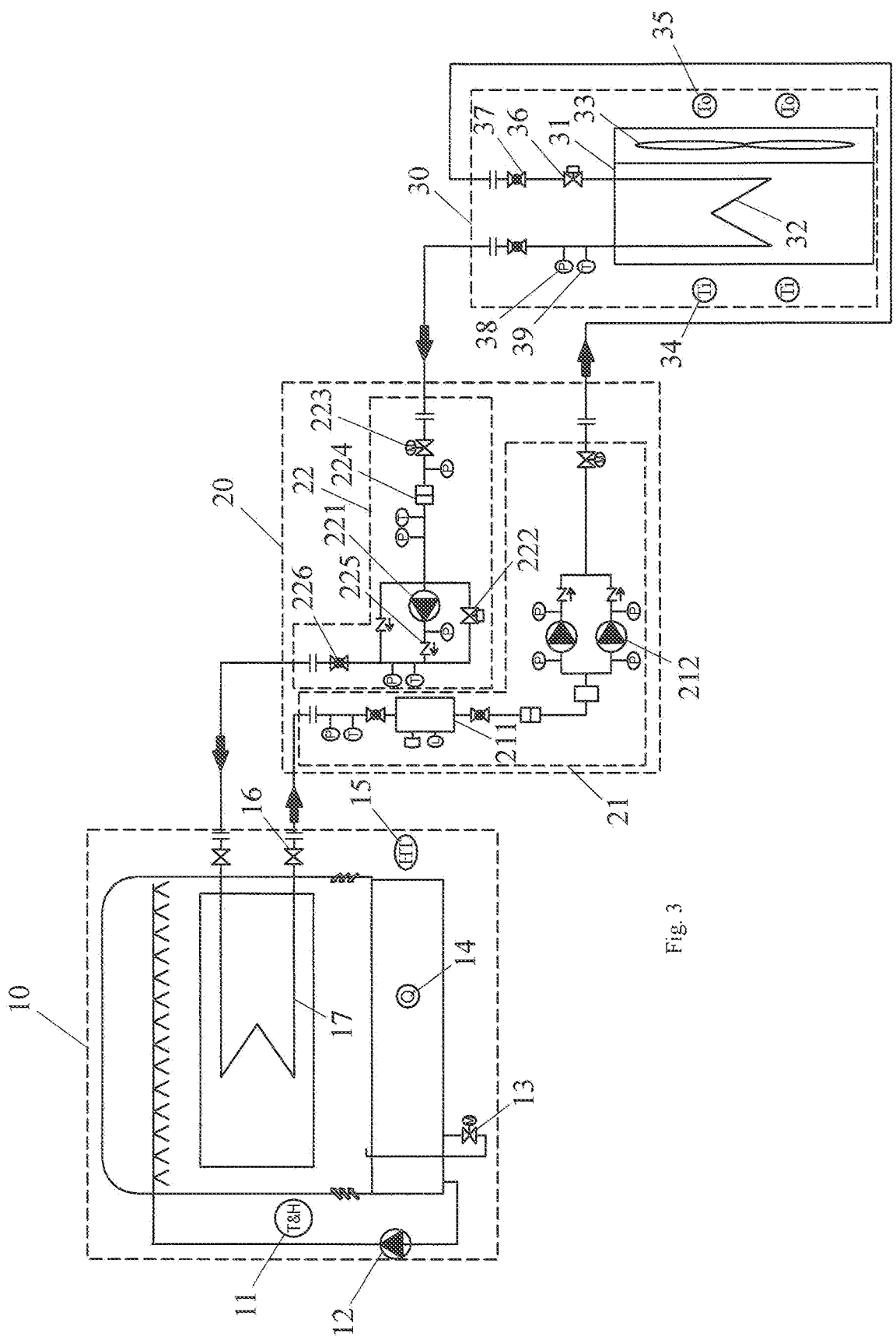
FIG. 3 is a schematic view shows structure of the cooling system according to the first embodiment of the present disclosure in a first specific example.

Reference is made to FIG. 3, which is a schematic view shows structure of the cooling system according to the first embodiment of the present disclosure in a first specific example. As shown in FIG. 3, the evaporative condenser 10 may specifically comprise: a wet bulb temperature sensor 11, a spray pump 12, a drain valve 13, a water quality sensor 14, an electrical heating sensor 15, a first shut-off valve 16 and a cooling coil 17.

The wet bulb temperature sensor 11 is provided for detecting temperature of the pray water.

The spray pump 12 is provided for transmitting the water in a water collector to a nozzle, and the water is sprayed on the cooling coil 17 by the nozzle.

The cooling coil 17 is provided for performing a phase-change heat exchange of a gaseous cooling agent with the spraying water to transform it into a liquid cooling agent.

The operation principle of the evaporative condenser 10 is that: the water in the water collector is first transmitted to the nozzle through the spray pump 12 and then being sprayed by the nozzle on the cooling coil 17, on which the gaseous cooling agent makes a phase-change heat exchange with the spraying water so as to be transformed into a liquid cooling agent.

The pump cabinet 20 comprises the first branch 21 and the second branch 22, specifically, the first branch 21 includes the liquid storage tank 211 and the fluorine pump 212, and the second branch 22 includes the compressor 221, a bypass valve 222, a third electrical ball valve 223, a filter 224, a second check valve 225 and a second shut-off valve 226.

An output end of the cooling coil 17 is connected to an input end of the liquid storage tank 211 via the first shut-off valve 16, and an input end of the cooling coil 17 is connected to an output end of the compressor 221 via the second shut-off valve 226.

There are two fluorine pumps 212 to guarantee a year-round operation of the cooling system, thus improving its reliability.

The bypass valve 222 may be opened in a first predetermined condition in which the compressor 221 is bypassed and the cooling system adopts a natural cooling mode, and may be closed in a second predetermined condition in which the compressor 221 is in operation and the cooling system adopts a mechanical cooling mode, which will be described in details below.

The operation principle of the pump cabinet 20 is that: a liquid cooling agent which is phase-change heat exchanged by means of the evaporative condenser 10 is first stored in the liquid storage tank 211 and the liquid cooling agent in the liquid storage tank 211 is transmitted to the heat exchange terminal 30 through the first branch 21 via the fluorine pump 212; a gaseous cooling agent which is air-returning heat exchanged by means of the heat exchange terminal 30 is then transmitted to the evaporative condenser 10 through the second branch 22 via the compressor 221.

Specifically, the heat exchange terminal 30 comprises: a back plate 31, a heat exchanger 32, a fan 33, an inlet air temperature sensor 34, an outlet air temperature sensor 35, a second electronic expansion valve 36, a third shut-off valve 37, a pressure sensor 38 and a temperature sensor 39.

An output end of the fluorine pump 212 is connected to an input end of the heat exchanger 32 via the third shut-off valve 37 and the second electronic expansion valve 36, and an input end of the compressor 221 is connected to an output end of the heat exchanger 32.

The operation principle of the heat exchange terminal 30 is that: a liquid cooling agent transmitted by the first branch 21 is air-returning heat exchanged by means of the heat exchanger 32 with the interior air of the data center via the fan 33 so as to be transformed into a gaseous cooling agent.

The heat exchanger 32 is in a form of a fan wall to enable a maximum heat exchange area and maximize the sharing to obtain an optimal overall heat exchange effect, so as to meet the requirement strategy of the use efficiency in all the current scenarios.

The operation principles of the evaporative condenser 10, the pump cabinet 20 and the heat exchange terminal 30 have been described above, respectively, and an overall operation principle of the cooling system will be explained below.

First, the fluorine pump 212 of the first branch 21 in the pump cabinet 20 transmits a liquid cooling agent in the liquid storage tank 211 to the heat exchange terminal 30 when power up the cooling system.

Then, the heat exchange terminal 30 makes an air-returning heat exchange to the liquid cooling agent transmitted through the first branch 21 with the interior air of the data center to transform it into a gaseous cooling agent.

Next, the compressor 221 of the second branch 22 in the pump cabinet 20 transmits the gaseous cooling agent which is air-returning heat exchanged via the heat exchange terminal to the evaporative condenser 10 through the second branch 22.

Next, the evaporative condenser 10 makes a phase-change heat exchange to the gaseous cooling agent transmitted through the second branch 22 in the pump cabinet 20 with spraying water to transform it into a liquid cooling agent.

Finally, the liquid storage tank 211 and the fluorine pump 212 of the first branch 21 in the pump cabinet 20 transmit the liquid cooling agent again to the heat exchange terminal 30 through the first branch 21.

In the present embodiment, the cooling system enables a liquid cooling agent of phase-change heat exchange working medium to make an air-returning heat exchange with the interior air of the data center at the heat exchange terminal 30 to cool the data center, and returns a gaseous cooling agent transformed via the air-returning heat exchange to the evaporative condenser 10 through a circulation path of the cooling agent formed by the evaporative condenser 10, the pump cabinet 20 and the heat exchange terminal 30 to transform, by means of a phase-change heat exchange, the gaseous cooling agent into a liquid cooling agent for performing an air-returning heat exchange with the interior air of the data center, so as to reduce heat exchange links and thus energy consumption of the cooling system to improve energy performance of the cooling system.

Moreover, the heat exchange terminal 30 uses the phase change of the cooling agent inside the data center to cool the data center, so as to enable a nearer cooling of the data center at the heat exchange terminal, such that energy performance of the cooling system can be greatly improved to meet the requirement of power efficiency.

Figure 4:
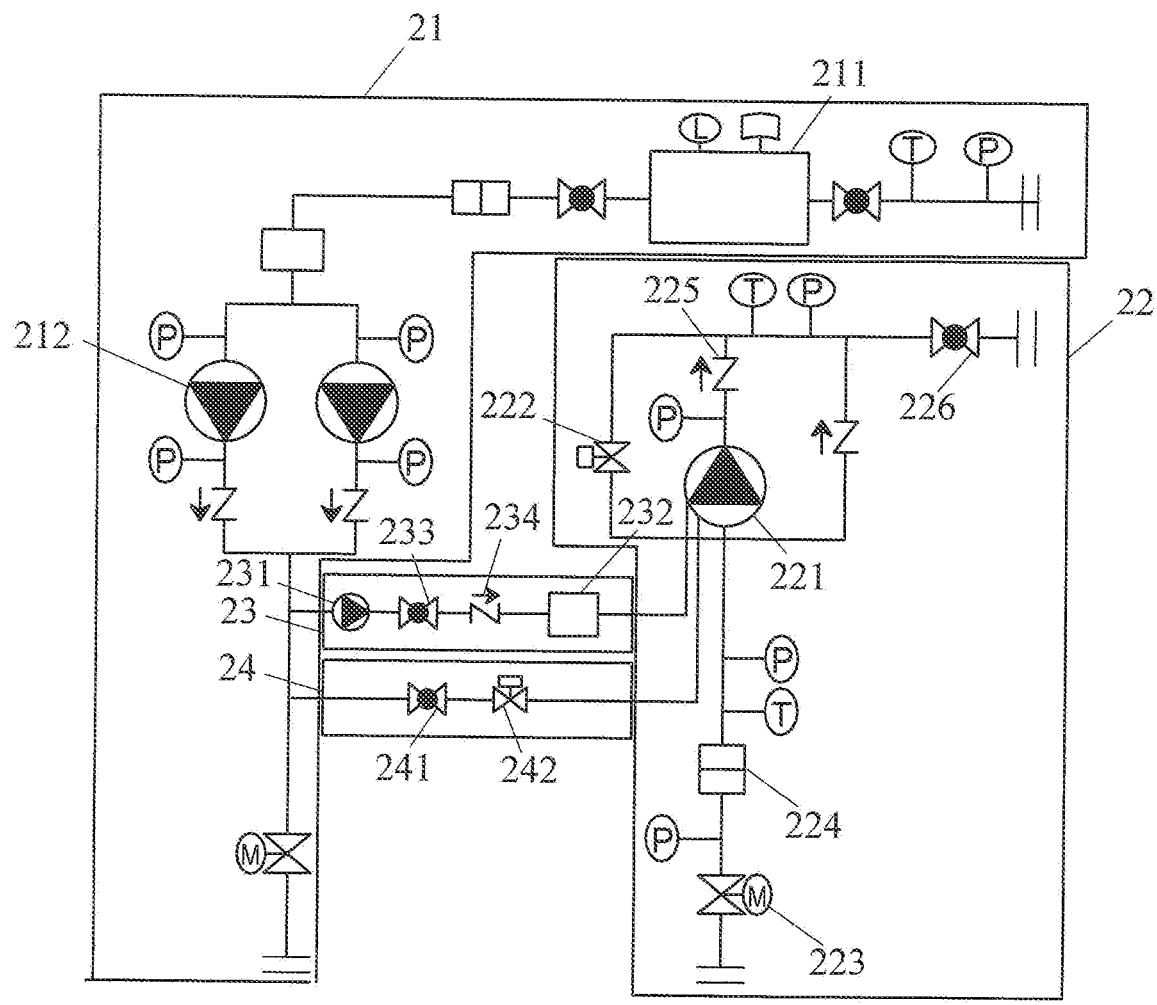
FIG. 4 is a schematic view shows structure of a pump cabinet in the cooling system according to the first embodiment of the present disclosure.

Reference is made to FIG. 4, which is a schematic view showing structure of the pump cabinet in the cooling system according to the first embodiment of the present disclosure. As shown in FIG. 4, the compressor 221 is an oil-free compressor, the pump cabinet 20 further comprises a third branch 23 which includes a make-up pump 231 and a gas tank 232, wherein an input end of the make-up pump 231 is connected to an output end of the fluorine pump 212, an output end of the make-up pump 231 is connected to an input end of the gas tank 232, and an output end of the gas tank 232 is connected to an input end of the compressor 221.

In this embodiment, the compressor 221 is an oil-free compressor such that its shaft is not in contact with bearings.

The third branch 23 is provided for supplying a gaseous cooling agent to the compressor 221 to make the shaft of the compressor 221 float so as not to contact with bearings thereof.

Specifically, the make-up pump 231 is provided for transmitting a liquid cooling agent, which is transmitted through the first branch 21, to the gas tank 232. The gas tank 232 is provided for storing the liquid cooling agent, transforming the liquid cooling agent into a gaseous cooling agent by heat and supplying the gaseous cooling agent to the compressor 221.

The shaft of the compressor 221 floats under a certain pressure of the gaseous cooling agent, so as not to contact with the bearings of the compressor 221, so as to eliminate any lubricants between the shaft and the bearings. In doing this, it is able to avoid the problem of oil return of the compressor and no oil return system is required for the cooling system. Further, it is able to reduce the design complexity and cost of the cooling system irrespective of the terminal form, pipeline length and difference in height between the indoor and outdoor of the cooling system, so as to further reduce energy consumption of the cooling system.

At the same time, the compressor 221 may also be provided for transmitting the gaseous cooling agent in the gas tank 232 to the second branch 22, such that the third branch 23 may have a function to supply gas to the second branch 22.

Optionally, as shown in FIG. 4, the third branch 23 also comprises a first electrical ball valve 233 by means of which the make-up pump 231 and the gas tank 232 are connected. An input end of the first electrical ball valve 233 is connected to an output end of the make-up pump 231, and an output end of the first electrical ball valve 233 is connected to an input end of the gas tank 232.

In this embodiment, the first electrical ball valve 233 may connected to a controller, the latter may in turn electrically connected to the gas tank 232 to receive liquid level monitoring result therefrom. When liquid level in the gas tank 232 is lower than a rated value, the controller controls the first electrical ball valve 233 to open while the make-up pump 231 starts to operate. When liquid level in the gas tank 232 is higher than a rated value, the controller controls the first electrical ball valve 233 to close while the make-up pump 231 stops.

In the present embodiment, opening and shut-off of the third branch 23 are controlled by the first electrical ball valve 233, so as to guarantee the gaseous cooling agent in the gas tank 232 matches the pressure for the shaft of the compressor 221 to float on one hand, and on the other hand to avoid excessive pressure of the gaseous cooling agent in the gas tank 232 for safety.

Optionally, as shown in FIG. 4, the third branch 23 also comprises a first check valve 234 by means of which the first electrical ball valve 233 and the gas tank 232 are connected. An input end of the first check valve 234 is connected to an output end of the first electrical ball valve 233, and an output end of the first check valve 234 is connected to an input end of the gas tank 232.

In this embodiment, the first check valve 234 is able to prevent the cooling agent in the third branch 23 from turning back to the first branch 21, so as to guarantee normal operation of the cooling system.

Optionally, as shown in FIG. 4, the pump cabinet 20 also comprises a fourth branch 24 which includes a second electrical ball valve 241. An input end of the second electrical ball valve 241 is connected to an output end of the fluorine pump 212, and an output end of the second electrical ball valve 241 is connected to an input end of the compressor 221.

In this embodiment, the second electrical ball valve 241 may connected to a controller which is able to receive motor temperature monitoring result of the compressor 221. When motor temperature of the compressor 221 is higher than a certain value, the second electrical ball valve 241 may be controlled to open. At this time, the fourth branch 24 shunts the first branch 21 and supplies a liquid cooling agent which is used for heat dissipation of the compressor 221 to the compressor 221. As such, there is no need for the cooling system to provide additional heat dissipation devices for the compressor 221, therefore reduce the cost.

Optionally, as shown in FIG. 4, the fourth branch 24 also comprises a first electronic expansion valve 242 by means of which the second electrical ball valve 241 and the compressor 221 are connected. An input end of the first electronic expansion valve 242 is connected to an output end of the second electrical ball valve 241, and an output end of the first electronic expansion valve 242 is connected to an input end of the compressor 221.

In this embodiment, the first electronic expansion valve 242 is provided for detecting motor temperature of the compressor 221 by means of a pipe thermometer bulb, and controlling opening degree of the valve based on the motor temperature of the compressor 221 to adjust flow rate of the liquid cooling agent in the fourth branch 24. As such, flow rate of the liquid cooling agent supplied to the motor of the compressor 221 can be well adjusted so as to provide an excellent cooling effect for the motor of the compressor 221.

Optionally, as shown in FIG. 3, the heat exchange terminal 30 comprises the back plate 31, the heat exchanger 32 and the fan 33, a ventilation passage is provided in the back plate 31 within which the heat exchanger 32 and the fan 33 are located. An input end of the heat exchanger 32 is connected to an output end of the fluorine pump 212, and an output end of the heat exchanger 32 is connected to an input end of the compressor 221.

In this embodiment, a liquid cooling agent transformed by phase-change heat exchange by means of the evaporative condenser 10 is powered by the fluorine pump 212 so as to be transmitted through an inlet of the heat exchanger 32 in the back plate into the heat exchanger 32 via the first branch 21. After that, by means of the heat exchanger 32, the liquid cooling agent is air-returning heat exchange with the interior air of the data center via the fan 33 and transformed into a gaseous cooling agent. The gaseous cooling agent is then powered by the compressor 221 so as to be transmitted to the evaporative condenser 10 through the second branch 22.

As such, the heat exchange terminal 30 uses the phase change of the cooling agent inside the data center to cool the data center, so as to enable a nearer cooling of the data center at the heat exchange terminal, such that energy performance of the cooling system can be greatly improved to meet the requirement of power efficiency.

Optionally, the heat exchanger 32 is selected from one of the following types: copper tube aluminum fin heat exchanger; micro-channel heat exchanger.

In this embodiment, the heat exchanger 32 is in a form of a fan wall such as a traditional copper tube aluminum fin heat exchanger or a micro-channel heat exchanger used in the field of automobile air conditioner. Of course, other types of heat exchanger can also be employed which are not limited herein.

In this way, it is possible to obtain a maximum heat exchange area and maximize the sharing to obtain an optimal overall heat exchange effect, so as to meet the requirement strategy of the use efficiency in all the current scenarios. It is also possible to increase the delivery speed.

Optionally, as shown in FIG. 3, the heat exchange terminal 30 also comprises the second electronic expansion valve 36, an input end of the second electronic expansion valve 36 is connected to an output end of the fluorine pump 212 and an output end of the second electronic expansion valve 36 is connected to an input end of the heat exchanger 32.

In this embodiment, the second electronic expansion valve 36 may be positioned at an inlet of the heat exchanger 32. The second electronic expansion valve 36 is provided for detecting load temperature of the back plate 31 by means of a pipe thermometer bulb, and controlling opening degree of the valve when a change in the load temperature of the back plate 31 is detected to adjust flow rate of the liquid cooling agent entering the heat exchanger 32. For example, opening degree of the valve is controlled to become larger through superheat of the pipe thermometer bulb, and opening degree of the valve is controlled to become smaller through supercooling of the pipe thermometer bulb.

In this way, flow rate of the liquid cooling agent supplied to the heat exchanger 32 can be well adjusted so as to save the cooling agent, reduce the cost and provide an excellent cooling effect for the data center.

Optionally, said system also comprises a first temperature sensor, a second temperature sensor, the bypass valve 222 and a controller. The first temperature sensor is located within the evaporative condenser 10, the second temperature sensor is located at an outlet of the ventilation passage, the bypass valve 222 is connected to the compressor 221 in parallel, and the controller is electrically connected to the first temperature sensor, the second temperature sensor and the bypass valve 222, respectively.

In this embodiment, the first temperature sensor may be the wet bulb temperature sensor 11 provided in the evaporative condenser 10, the second temperature sensor may be the outlet air temperature sensor 35 provided in the heat exchange terminal 30, and the bypass valve 222 is located in the pump cabinet 20, as shown in FIG. 3.

The first temperature sensor is provided for detecting temperature of the spraying water, the second temperature sensor is provided for detecting outlet air temperature of the ventilation passage, and the controller is provided for receiving the temperature of the spraying water as well as the outlet air temperature of the ventilation passage to control the bypass valve 222 to open or close based on said temperatures.

Specifically, the cooling system may adopt two operating modes: a natural cooling mode is adopted when an outdoor temperature of the spraying water, i.e. a wet bulb temperature is lower than an outlet air temperature of the ventilation passage, i.e. an indoor outlet air temperature by 9° C., at this time, the controller may control the bypass valve 222 to open to bypass the compressor 221; a mechanical cooling mode is adopted when the outdoor temperature of the spraying water, i.e. the wet bulb temperature is higher than the outlet air temperature of the ventilation passage, i.e. the indoor outlet air temperature by 9° C., at this time, the controller may control the bypass valve 222 to close to enable the compressor 221 to operate.

In this embodiment, by adopting two operating modes, it is possible to further reduce energy consumption of the cooling system to improve its energy performance.

The above specific embodiments are not intended to limit the protection scope of the present disclosure. The person having ordinary skill in the art should note that any modifications, combinations, sub-combinations and alternations are possible based on the design requirement and other factors. Any modifications, equivalents and improvements etc. within the spirit and principle of the present disclosure shall all be included in the protection scope thereof.

What is claimed is:

1. A cooling system, comprising: an evaporative condenser, a pump cabinet and a heat exchange terminal, the pump cabinet comprises a first branch and a second branch, wherein the first branch comprises a liquid storage tank and a fluorine pump, an input end of the liquid storage tank is connected to an output end of the evaporative condenser, an output end of the liquid storage tank is connected to an input end of the fluorine pump, and an output end of the fluorine pump is connected to an input end of the heat exchange terminal, the second branch comprises a compressor, an input end of the compressor is connected to an output end of the heat exchange terminal and an output end of the compressor is connected to an input end of the evaporative condenser, wherein the compressor is an oil-free compressor, the pump cabinet further comprises a third branch which includes a make-up pump and a gas tank, and wherein an input end of the make-up pump is connected to an output end of the fluorine pump, an output end of the make-up pump is connected to an input end of the gas tank, and an output end of the gas tank is connected to an input end of the compressor, wherein the third branch further comprises a first electrical ball valve by means of which the make-up pump and the gas tank are connected, wherein an input end of the electrical ball valve is connected to an output end of the make-up pump, and an output end of the electrical ball valve is connected to an input end of the gas tank, wherein the third branch further comprises a first check valve by means of which the first electrical ball valve and the gas tank are connected, and wherein an input end of the first check valve is connected to an output end of the first electrical ball valve, and an output end of the first check valve is connected to an input end of the gas tank.

2. The system according to claim 1, wherein the pump cabinet further comprises a fourth branch which includes a second electrical ball valve, and wherein an input end of the second electrical ball valve is connected to an output end of the fluorine pump, and an output end of the second electrical ball valve is connected to an input end of the compressor.

3. The system according to claim 2, wherein the fourth branch further comprises a first electronic expansion valve by means of which the second electrical ball valve and the compressor are connected, and wherein an input end of the first electronic expansion valve is connected to an output end of the second electrical ball valve, and an output end of the first electronic expansion valve is connected to an input end of the compressor.

4. The system according to claim 1, wherein the heat exchange terminal comprises a back plate, a heat exchanger and a fan, a ventilation passage is provided in the back plate, the heat exchanger and the fan are located within the ventilation passage, and wherein an input end of the heat exchanger is connected to an output end of the fluorine pump, and an output end of the heat exchanger is connected to an input end of the compressor.

5. The system according to claim 4, wherein the heat exchanger is selected from one of the following types:
copper tube aluminum fin heat exchanger;
micro-channel heat exchanger.

6. The system according to claim 4, wherein the heat exchange terminal further comprises a second electronic expansion valve, and wherein an input end of the second electronic expansion valve is connected to an output end of the fluorine pump, and an output end of the second electronic expansion valve is connected to an input end of the heat exchanger.

7. The system according to claim 4, wherein the system further comprises a first temperature sensor, a second temperature sensor, a bypass valve and a controller, and wherein the first temperature sensor is located within the evaporative condenser, the second temperature sensor is located at an outlet of the ventilation passage, the bypass valve is connected to the compressor in parallel, and the controller is electrically connected to the first temperature sensor, the second temperature sensor and the bypass valve, respectively.

* * * * *